(12) United States Patent
Hokomoto et al.

(10) Patent No.: US 8,169,021 B2
(45) Date of Patent: May 1, 2012

(54) TRENCH GATE SEMICONDUCTOR DEVICE AND METHOD OF MANUFACTURING THE SAME

(75) Inventors: Yoshitaka Hokomoto, Ibo-gun (JP); Takuma Hara, Kamakura (JP)

(73) Assignee: Kabushiki Kaisha Toshiba, Tokyo (JP)

(*) Notice: Subject to any disclaimer, the term of this patent is extended or adjusted under 35 U.S.C. 154(b) by 335 days.

(21) Appl. No.: 12/199,224

(22) Filed: Aug. 27, 2008

(65) Prior Publication Data

US 2009/0057757 A1    Mar. 5, 2009

(30) Foreign Application Priority Data

Aug. 31, 2007   (JP) .................. 2007-225414

(51) Int. Cl.
H01L 29/76 (2006.01)
H01L 21/336 (2006.01)
H01L 29/94 (2006.01)
H01L 31/062 (2012.01)
H01L 31/113 (2006.01)
H01L 31/119 (2006.01)

(52) U.S. Cl. .................. 257/330; 257/E29.26
(58) Field of Classification Search .................. 257/330, 257/E29.26
See application file for complete search history.

(56) References Cited

U.S. PATENT DOCUMENTS

| | | | |
|---|---|---|---|
| 6,049,108 A | 4/2000 | Williams et al. | |
| 6,351,018 B1 | 2/2002 | Sapp | |
| 6,404,032 B1 | 6/2002 | Kitada et al. | |
| 6,621,107 B2 | 9/2003 | Blanchard et al. | |
| 6,855,998 B2 | 2/2005 | Hokomoto | |
| 7,436,022 B2 * | 10/2008 | Bhalla et al. .................. | 257/328 |
| 2007/0045700 A1 | 3/2007 | Ohtani et al. | |

FOREIGN PATENT DOCUMENTS

| | | |
|---|---|---|
| EP | 1 139 433 A1 | 10/2001 |
| JP | 1-138754 | 5/1989 |
| JP | 11-154748 | 6/1999 |
| JP | 2001-284604 | 10/2001 |
| JP | 2002-33479 | 1/2002 |
| JP | 2007-59805 | 3/2007 |

* cited by examiner

*Primary Examiner* — David S Blum
(74) *Attorney, Agent, or Firm* — Oblon, Spivak, McClelland, Maier & Neustadt, L.L.P.

(57) ABSTRACT

A trench gate semiconductor device including: a semiconductor layer having a first conductivity type; a first diffusion region having a second conductivity type having a planar structure on the semiconductor layer; a second diffusion region having the first conductivity type positioned selectively on the first diffusion region; a gate electrode provided via a gate insulation film in each first trench facing the second diffusion region and penetrating through the first diffusion region to reach the semiconductor layer; a first semiconductor region of the second conductivity type provided at a position, in the semiconductor layer, apart in a lateral direction from the first diffusion region; a second semiconductor region of the second conductivity type provided at a position, in the first diffusion region, between the adjacent first trenches; and a main electrode in contact with the semiconductor layer and the second diffusion region.

17 Claims, 2 Drawing Sheets

TRENCH GATE SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-225414, filed on Aug. 31, 2007; the entire contents of which are incorporated herein by reference.

BACKGROUND

1. Field of the Invention

The present invention relates to a trench gate semiconductor device having a gate electrode in a trench formed in a semiconductor region and a method of manufacturing the same, and in particular, to a trench gate semiconductor device in which a Schottky diode is integrally formed in parallel between a source and a drain and a method of manufacturing the same.

2. Description of the Related Art

In a DC-DC converter for voltage step-down, a MOS transistor is used as a switching (chopping) element. In a period during which current passage from a primary side to a secondary side is interrupted by the switching, a reflux structure by a flywheel diode can be useful to prevent the interruption of the current on a load side. However, in accordance with an increasing demand for lower voltage as output voltage of the load side, forward voltage drop of the aforesaid diode cannot be neglected as a loss. A structure used to solve this problem is to provide another MOS transistor (second MOS transistor) instead of the diode, and to turn on this MOS transistor between its source and its drain in the same period as a conduction period of the diode. A so-called trench gate MOS transistor having a trench gate structure is one of MOS transistors for such use.

In the above-described structure, it is difficult to control gate voltage so as to turn on the second MOS transistor in exactly the same period as the conduction period of the diode, and in actual practice, a period when the chopping MOS transistor and the second MOS transistor both turn off (dead time) is provided. In this dead time, the second MOS transistor functions as a diode (pn junction diode) that the second MOS transistor has as its parasitic element. This period, even though short, also involves a problem of forward voltage drop as a loss. As a solution, there has come into use a MOS transistor in which a Schottky diode is internally formed in parallel in the second MOS transistor so that the forward voltage drop in the dead time can be reduced.

In the MOS transistor having the built-in Schottky diode, it is necessary to be careful about breakdown tolerance as one of its ratings when backward voltage is applied to the Schottky diode (and when the drain-source is off). In the MOS transistor having the Schottky diode, when the backward voltage is applied, breakdown generally occurs in the Schottky diode portion first at voltage lower than voltage at which breakdown occurs in the MOS transistor portion, due to the property of the element. It is preferable that current allowed to pass at this time is larger since this means that the breakdown tolerance is ensured. However, the Schottky diode is an additionally formed diode and it generally occupies a small area. Therefore, the tolerable breakdown current is lower than that of a MOS transistor having no built-in Schottky diode.

An example of a MOS transistor having a built-in Schottky diode is disclosed in the following JP-A 11-154748(KOKAI) (see, for example, FIG. 6 in the same document).

[Reference 1] JP-A 11-154748(KOKAI)

SUMMARY

A trench gate semiconductor device according to one aspect of the present invention includes: a semiconductor layer of a first conductivity type; a diffusion region of a second conductivity type formed as a planar structure on the semiconductor layer of the first conductivity type; a diffusion region of the first conductivity type positioned selectively on an upper side of the diffusion region of the second conductivity type so as to be in contact with the diffusion region of the second conductivity type; a gate electrode provided in a first trench via a gate insulation film, the first trench being formed in plurality in substantially one direction and each being formed to face the diffusion region of the first conductivity type and to penetrate through the diffusion region of the second conductivity type to reach the semiconductor layer of the first conductivity type; and a first semiconductor region of the second conductivity type provided at a position, in the semiconductor layer of the first conductivity type, apart in a lateral direction from the diffusion region of the second conductivity type; a second semiconductor region of the second conductivity type provided at a position, in the diffusion region of the second conductivity type, between adjacent trenches among the first trenches; and a main electrode formed in contact with the semiconductor layer of the first conductivity type and the diffusion region of the first conductivity type.

A method of manufacturing a trench gate semiconductor device according to another aspect of the present invention includes: forming a diffusion region of a second conductivity type as a planar structure on an upper side of a semiconductor layer of a first conductivity type; forming a diffusion region of the first conductivity type selectively on an upper side of the diffusion region of the second conductivity type; forming a trench having a sidewall, part of which is open to the diffusion region of the first conductivity type, and penetrating through the diffusion region of the second conductivity type to reach the semiconductor layer of the first conductivity type; forming, in the trench, a gate insulation film and a gate electrode surrounded by the gate insulation film; forming a first semiconductor region of the second conductivity type at a position which is in a deep portion of the semiconductor layer of the first conductivity type and is in a lateral-direction outer side of the diffusion region of the second conductivity type; and forming a second semiconductor region of the second conductivity type in a deep portion of the diffusion region of the second conductivity type so as to be apart from the gate insulation film and the gate electrode, the second semiconductor region having a higher impurity concentration than an impurity concentration of a surrounding area.

DETAILED DESCRIPTION

Description of Embodiments

Embodiments of the present invention will be described with reference to the drawings, but these drawings are provided only for an illustrative purpose and are not to limit the present invention in any respect.

Figure 1:
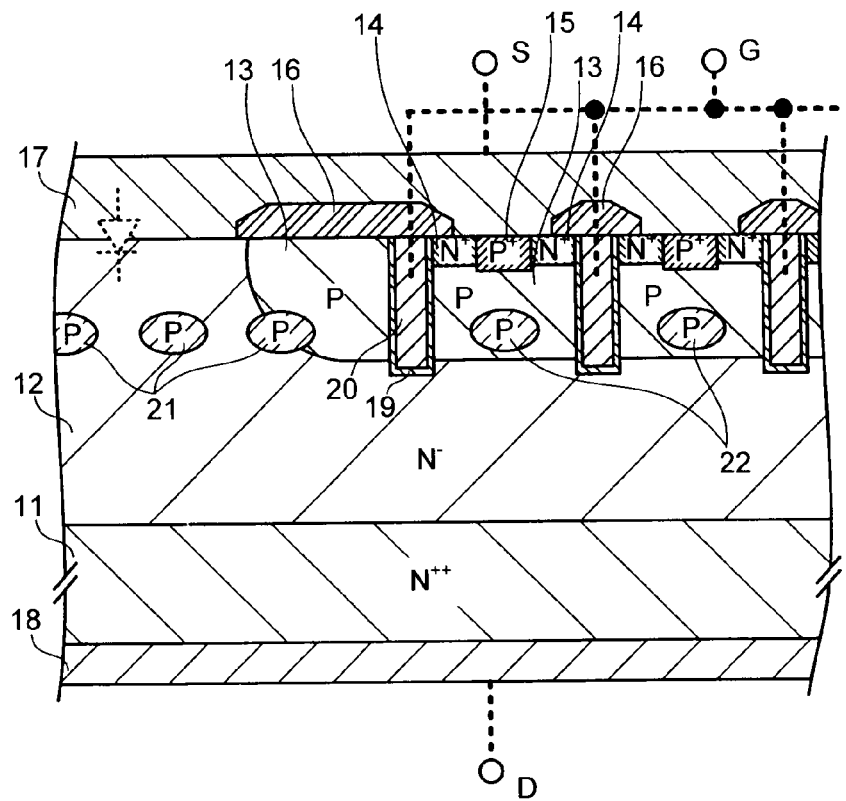
FIG. 1 is a cross-sectional view schematically showing the structure of a trench gate semiconductor device according to one embodiment of the present invention.

Hereinafter, the embodiments of the present invention will be described with reference to the drawings. FIG. 1 is a cross-sectional view schematically showing the structure of a trench gate semiconductor device (trench gate MOS transistor, as an example) according to one embodiment of the present invention. In the description here, n-type is defined as a first conductivity type and p-type is defined as a second conductivity type, but the embodiments to be described below can be carried out with these types interchanged. As shown in FIG. 1, the trench gate MOS transistor has an n-type semiconductor substrate 11, an n-type semiconductor layer 12 (drift layer; semiconductor layer of a first conductivity type), a p-type base layer 13 (diffusion region of a second conductivity type), n-type diffusion layers 14 (diffusion region of the first conductivity type), p-type contact layers 15, interlayer insulation films 16, a metal layer 17 (first main electrode), a metal layer 18 (second main electrode), gate insulation films 19, gate electrodes 20, first p-type doped layers 21 (first semiconductor region of the second conductivity type), and second p-type doped layers 22 (second semiconductor region of the second conductivity type).

Roughly, this trench gate MOS transistor is of a vertical type in which channels are formed in a vertical direction, and is a transistor of a type in which current flows therethrough in a thickness direction of the n-type semiconductor substrate 11. A region where the p-type base layer 13 is overlappingly formed as the planar structure on the n-type semiconductor layer 12 (and a vertical (depth) extension of this region) is a portion functioning as a transistor, and a region where the p-type base layer 13 is not overlappingly formed and the n-type semiconductor layer 12 is exposed to be in contact with the metal layer 17 (and a vertical (depth) extension of this region) is a portion functioning as a Schottky diode.

The n-type semiconductor substrate 11 is, for example, a silicon substrate and its impurity concentration is high to some degree (its impurity concentration is, for example, $1 \times 10^{21}$ cm$^{-3}$) for ensuring conductivity. On its exposed surface (rear surface) side, the metal layer 18 functioning as a drain electrode (a cathode electrode for the Schottky diode) is stacked (the thickness of the metal layer 18 is, for example, 2 μm to 3 μm). The metal layer 18 is in electrical conductivity with a drain terminal D.

The n-type semiconductor layer 12 is stacked on an upper (front surface) side in FIG. 1 of the n-type semiconductor substrate 11, and the impurity concentration of the n-type semiconductor layer 12 (for example, $1 \times 10^{16}$ cm$^{-3}$) is lower than that of the n-type semiconductor substrate 11. The n-type semiconductor layer 12 functions as a drift region in the transistor portion and functions as a semiconductor side forming Schottky junction in the Schottky diode portion. The n-type semiconductor layer 12 has a thickness (total thickness up to the metal layer 17) of, for example, 3 μm, and it is formed on the n-type semiconductor substrate 11 to this thickness in advance by, for example, epitaxial growth.

The p-type base layer 13 is a semiconductor layer formed as the planar structure on the n-type semiconductor layer 12. Specifically, p-type impurities are selectively implanted only in the portion which is to function as the transistor, in a two dimensional range of the n-type semiconductor layer 12, and the p-type impurities are further thermally diffused to be formed as p-type regions. The p-type base layer 13 has a depth of, for example, 1 μm, and the concentration of the p-type impurities is relatively high in its portion near a front surface and is relatively low in its deeper portion, due to the processes of the implantation and the thermal diffusion of the p-type impurities. The concentration distribution (profile) thereof is, for example, $1 \times 10^{18}$ cm$^{-3}$ to $1 \times 10^{16}$ cm$^{-3}$.

Each of the gate insulation films 19 is an insulation film which is formed in such a manner that a trench (first trench) is first formed so as to penetrate through the p-type base layer 13 to reach the n-type semiconductor layer 12 and sidewalls and a bottom surface of the trench are, for example, thermally oxidized (that is, for example, a silicon oxide film. A silicon oxynitride film, a high dielectric constant film, a film made up of the combination of these films, or the like may be formed by a process which is not simple thermal oxidation). As shown in FIG. 1, the plural trenches are formed to extend in a direction orthogonal to the paper as shown in FIG. 1, but another plurality of trenches parallel to the paper may be formed orthogonally to the plural trenches (that is, the trenches are formed in lattice in a plane view). Each of the trenches has a width of, for example, 0.5 μm, and the pitch of the trenches is, for example, 2.0 μm. The thickness of the gate insulation films 19 is, for example, 50 nm.

Each of the gate electrodes 20 is a conductor (for example, a polycrystalline silicon high in impurity concentration) embedded in the trench and surrounded by the gate insulation film 19. The gate electrodes 20 in the trenches are in electrical conductivity with one another at a not-shown position and are in conductivity with a single gate terminal G.

The n-type diffusion layers 14 are n-type impurity diffusion layers which are formed at selective positions (positions adjacent to the gate insulation films 19) in a front surface side of the p-type base layer 13. For example, the n-type diffusion layers 14 can be formed in such a manner that n-type impurities are selectively implanted in the p-type base layer 13 and are thermally diffused. The thickness thereof is, for example, 0.5 μm, and the n-type impurity concentration thereof is, for example, $1 \times 10^{20}$ cm$^{-3}$. Channels are formed in regions, in the p-type base layer 13, sandwiched by the n-type diffusion layers 14 and the n-type semiconductor layer 12 and positioned near the gate insulation films 19. That is, the n-type diffusion layers 14 function as source regions.

The p-type contact layers 15 are contact layers which are interposed in order to further ensure that the metal layer 17 and the p-type base layer 13 are in electrical conductivity with each other based on ohmic contact. The p-type contact layers 15 may be formed at any positions except the position of the aforesaid n-type diffusion layers 14. The thickness of the p-type contact layers 15 can be, for example, 0.2 μm, and p-type impurity concentration thereof can be, for example, $1 \times 10^{20}$ cm$^{-3}$. For example, the p-type contact layers 15 can be formed in such a manner that p-type impurities are implanted in the p-type base layer 13 to be thermally diffused.

The interlayer insulation films 16 are insulation films (for example, silicon oxide films, stacked films each made up of a silicon oxide film and a silicon nitride film, or the like) formed on the semiconductor region except positions on the n-type diffusion layers 14, the p-type contact layers 15, and the Schottky diode region of the n-type semiconductor layer 12, all of which are to be in contact with the metal layer 17.

The metal layer 17 is an electrode (its thickness is, for example, 3.0 μm) stacked on the semiconductor region including positions on the interlayer insulation films 16, and is in contact with the n-type diffusion layers 14 to function as a source electrode. The metal layer 17 as the source electrode is in conductivity with a source terminal S. Since the metal layer 17 is in contact with the p-type contact layers 15, the p-type base layer 13 is kept at the same potential as that of the n-type diffusion layers 14 as the source regions, which prevents the p-type base layer 13 and the n-type diffusion layers 14 from being in a potential relation causing forward voltage. Further, the contact of the metal layer 17 with the n-type semiconductor layer 12 makes it possible to form a Schottky barrier in a contact portion therebetween. That is, the metal layer 17 functions as an anode electrode for the Schottky diode.

Next, the operation will be roughly described. First, in a state where the gate electrodes 20 are higher in potential than the n-type diffusion layers 14 as the source regions by a threshold voltage or more, the transistor turns on. Specifically, the channels are formed in the p-type base layer 13 facing the gate insulation films 19, and current flows in a route of the drain terminal D, the metal layer 18, the n-type semiconductor substrate 11, the n-type semiconductor layer 12, the p-type base layer 13 (channels), the n-type diffusion layers 14, the metal layer 17, and the source terminal S. Though slight backward voltage is generated in the contact portion between the metal layer 17 and the n-type semiconductor layer 12, it has no influence on the operation since on-resistance in the transistor region is small.

Incidentally, in the same state, it is also possible to pass current in a reverse direction from the source terminal S to the drain terminal D. In this case, though slight forward voltage is generated in the contact portion between the metal layer 17 and the n-type semiconductor layer 12, it has no influence on the operation either since the on-resistance in the transistor region is small.

Next, in a state where the gate electrodes 20 are not higher in potential than the n-type diffusion layers 14 as the source regions by the threshold voltage or more, the transistor turns off. In this off state, when the source terminal S is higher in potential than the drain terminal D, an interface between the p-type base layer 13 and the n-type semiconductor layer 12 is in a state where forward voltage of the pn junction is applied, and the Schottky junction portion between the metal layer 17 and the n-type semiconductor layer 12 is also in a state where the forward voltage is applied. Therefore, an on-state can occur only in the Schottky junction portion where the forward voltage drop is smaller. By thus decreasing the voltage drop, it is possible to reduce loss in a state where the operation as the diode is going on.

Further, in the aforesaid off state, when the source terminal S is lower in potential than the drain terminal D, the pn junction between the p-type base layer 13 and the n-type semiconductor layer 12 is in a backward voltage applied state, and the Schottky junction between the metal layer 17 and the n-type semiconductor layer 12 is also in the backward voltage applied state. Therefore, when the source terminal S is in a lower voltage state by some degree than the drain terminal D, breakdown occurs and thus breakdown current flows. Generally, breakdown occurs in the Schottky junction at lower voltage than in the pn junction. Generally, an element is used to prevent the occurrence of the breakdown, but on the other hand, tolerance (breakdown tolerance) in a state where the breakdown can occur generally has to be taken into consideration.

This embodiment is specially designed so that a portion where the breakdown occurs when the backward voltage is applied is not the Schottky junction portion between the metal layer 17 and the n-type semiconductor layer 12 but is limited only to the pn junction as the interface between the p-type base layer 13 and the n-type semiconductor layer 12. For this purpose, p-type doped layers 21 are formed in the n-type semiconductor layer 12, and p-type doped layers 22 are formed in the p-type base layer 13.

The plural p-type doped layers 21 are formed at, for example, a predetermined depth in the n-type semiconductor layer 12, which functions as the Schottky diode, to be apart from one another, for instance. As a result of thus forming the p-type doped layers 21, when backward voltage is applied to the region functioning as the Schottky diode, a formation region of a depletion layer in the n-type semiconductor layer 12 is increased in the depth direction of this region. Therefore, backward withstand voltage of the Schottky diode increases.

Incidentally, the p-type doped layers 21 can be formed in such a manner that, for example, p-type impurities are selectively implanted in the n-type semiconductor layer 12 at some degree of acceleration voltage and these p-type impurities are thermally diffused. The number, pitch, formation depth, and so on thereof can be appropriately designed and selected based on required backward withstand voltage. The same applies to the impurity concentration of the p-type doped layers 21, and the impurity concentration can be, for example, about $1 \times 10^{18}$ cm$^{-3}$. Generally, by forming the plural p-type doped layers 21 in a predetermined horizontal plane to be apart from one another, it is possible to expand the formation range of the depletion layer in the n-type semiconductor layer 12, which is preferable in view of increasing the withstand voltage in the Schottky diode portion.

The p-type doped layers 22 are formed in the p-type base layer 13 which is the region functioning as the transistor, so as to be substantially at the same depth position as the p-type doped layers 21. More typically, as shown in FIG. 1, the p-type doped layers 22 can be formed at a depth position which is under the p-type contact layers 15 and close to the n-type semiconductor layer 12. Thus forming the p-type doped layers 22 prevents the depletion layer from being formed in a wide range in the p-type base layer 13 when backward voltage is applied. This is because a certain degree deep portion in the p-type base layer 13 originally has a low p-type impurity concentration, but comes to have a higher p-type impurity concentration owing to the newly formed p-type doped layers 22. Therefore, the backward withstand voltage lowers in the region functioning as the transistor.

The p-type doped layers 22 can also be formed in such a manner that, for example, p-type impurities are selectively implanted in the p-type base layer 13 at a certain degree of acceleration voltage and are thermally diffused. The number, pitch, formation depth, and so on thereof can be appropriately designed and selected based on backward withstand voltage which is to be lowered. The same applies to the impurity concentration of the p-type doped layers 22 and the impurity concentration thereof can be, for example, about $1 \times 10^{18}$ cm$^{-3}$. Incidentally, the p-type doped layers 22 can be formed in the same time process as that for forming the p-type doped layers 21, by the implantation and diffusion of the p-type impurities. This can improve manufacturing efficiency.

owing to the above-described formation of the p-type doped layers 21, 22, in the trench gate MOS transistor of this embodiment, the withstand voltage in the portion functioning as the transistor is lower than that of the Schottky diode portion, and therefore, if the breakdown occurs, backward current flows in the portion functioning as the transistor. The portion functioning as the transistor occupies a relatively larger area than the Schottky diode portion, which is to be described next, and thereby tolerable breakdown current can be increased. Therefore, breakdown tolerance can be improved. Further, since the formation position of each of the p-type doped layers 22 is substantially the center of the adjacent trenches (first trenches) in which the gate electrodes 20 are embedded, the influence that the trenches have on the route where the breakdown current flows is small, enabling more smooth passage of the breakdown current, which contributes to improvement in breakdown tolerance.

Figure 2:
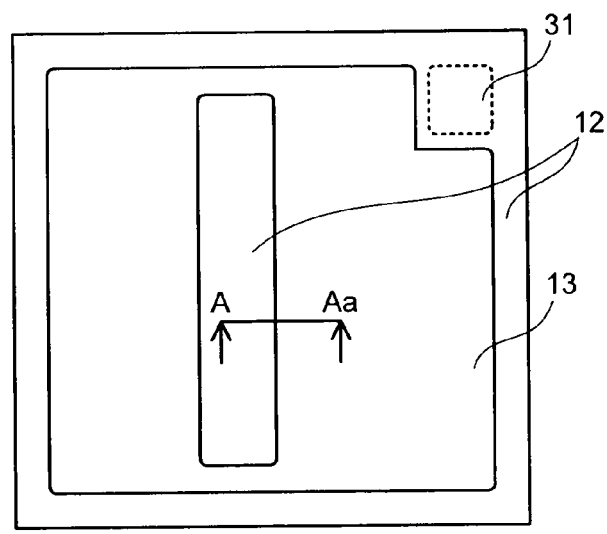
FIG. 2 is a virtual top view showing a front surface of a semiconductor region of the trench gate semiconductor device shown in FIG. 1.

FIG. 2 is a virtual top view showing a front surface of the semiconductor region of the trench gate MOS transistor shown in FIG. 1. For convenience sake, portions other than the n-type semiconductor layer 12 and the p-type base layer 13 are omitted. The reference numerals in FIG. 2 correspond to those in FIG. 1, and a cross section taken along A-Aa line seen in the arrow direction in FIG. 2 corresponds to the cross-sectional view shown in FIG. 1. The reference numeral 31 denotes a region where a gate electrode pad should be positioned.

In FIG. 2, the region of the p-type base layer 13 formed as the planar structure on the n-type semiconductor layer 12 is the portion functioning as the transistor. An island region where the p-type base layer 13 is not overlappingly positioned and the n-type semiconductor layer 12 is exposed is the portion functioning as the Schottky diode. The Schottky diode is additionally built in the MOS transistor and generally occupies a small area. Therefore, the breakdown current tolerable in this portion is lower than that in a MOS transistor having no built-in Schottky diode. In this embodiment, since the breakdown current is passed in the portion functioning as the transistor occupying a relatively large area, the tolerable breakdown current can be increased. Therefore, the breakdown tolerance can be improved.

In FIG. 2, in addition to the island region where the p-type base layer 13 is not overlappingly positioned and the n-type semiconductor layer 12 is exposed, a region, outside the p-type base layer 13, where the n-type semiconductor layer 12 is exposed may function as the Schottky diode. In this case, the p-type doped layers 21 are provided at a depth position of the region, outside the p-type base layer 13, where the n-type semiconductor layer 12 is exposed.

Figure 3:
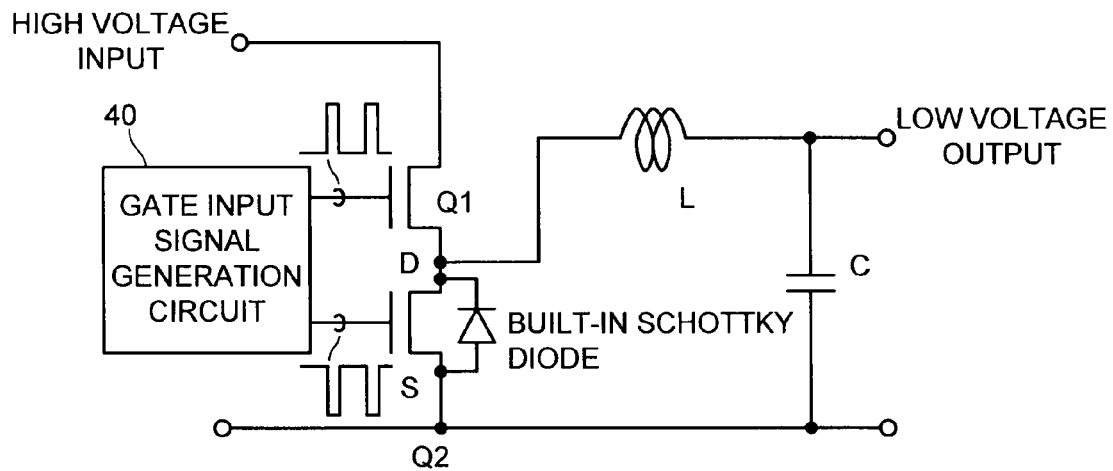
FIG. 3 is a circuit diagram showing the structure of a DC-DC converter in which the trench gate semiconductor device shown in FIG. 1 is usable.

FIG. 3 shows the structure of a DC-DC converter in which the trench gate MOS transistor shown in FIG. 1 can be used. The trench gate MOS transistor in FIG. 1 can be used as a transistor Q2 on a lower side in FIG. 3. The structure of such a DC-DC converter is well known, but the operation thereof will be described below just to make sure.

In this circuit, high input voltage is applied across input terminals (primary side) on the left in FIG. 3 and low output voltage is obtained between output terminals (secondary side) on the right in FIG. 3. A ratio of these voltages can be set according to a duty ratio of switching (chopping) in the transistor Q1. When the transistor Q1 is on, current flows from the primary side to the secondary side, and when the transistor Q1 is off, the transistor Q2 turns on owing to the reflux of the secondary side current in an unchanged direction. An inductor L and a capacitor C work as a low pass filter. In order to control on/off of the transistors Q1, Q2, gate input signals almost opposite in phase generated in a gate input signal generation circuit 40 are supplied to gates of the transistors Q1, Q2.

The reflux when the transistor Q1 is off is enabled only by providing a diode (the lower side in FIG. 3 is an anode) instead of the transistor Q2. However, when the output voltage necessary on the secondary side is low, the forward voltage drop of the diode cannot be neglected as a loss. Therefore, for reducing the voltage drop, the transistor Q2 whose on/off is almost in opposite phase to on/off of the transistor Q1 is provided as shown in FIG. 3.

Strictly, the on/off phases of the transistors Q1, Q2 are set so that a short period when the both turn off is provided (in terms of the shown pulses, the width of a negative pulse to Q2 is slightly wider than the width of a positive pulse to Q1). This prevents the occurrence of a period when the primary side is short-circuited. However, owing to the period when the transistors Q1, Q2 are both off (dead time), the pn junction diode that the transistor Q2 has as its structural parasitic element turns on in the normal transistor Q2. The forward voltage drop of this diode cannot be neglected as a loss either.

Therefore, as described with reference to FIG. 1, the transistor Q2 has the Schottky diode which is structurally built therein and provided in parallel between the source and the drain. With this structure, the source/drain voltage of the transistor Q2 in the dead time is effectively lowered.

Figure 4:
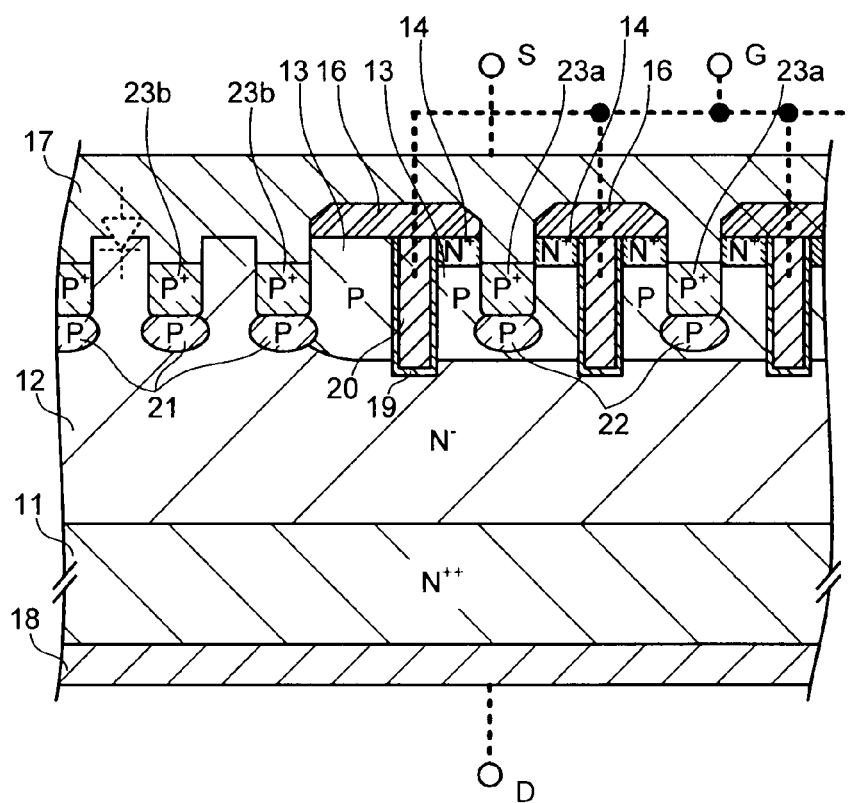
FIG. 4 is a cross-sectional view schematically showing the structure of a trench gate semiconductor device according to another embodiment of the present invention.

Next, a trench gate semiconductor device (trench gate MOS transistor) according to another embodiment of the present invention will be described with reference to FIG. 4. FIG. 4 is a cross-sectional view schematically showing the structure of the trench gate semiconductor device (trench gate MOS transistor) according to another embodiment of the present invention. In FIG. 4, the same reference numerals and symbols are used to designate components which are the same as or corresponding to those previously described, and redundant description thereof will be omitted.

In this embodiment, trenches (second trenches) reaching high-concentration p-type doped layers 23b are formed in an n-type semiconductor layer 12, and a metal layer 17 extends in the trenches. Further, the high-concentration p-type doped layers 23b are positioned immediately on first doped layers 21 and they are in contact with each other. The impurity concentration of the high-concentration p-type doped layers 23b is higher than that of the p-type doped layers 21, and is, for example, about $1 \times 10^{20}$ cm$^{-3}$.

With this structure, the p-type doped layers 21 are equal in potential to the metal layer 17, and when backward voltage is applied, the formation of a depletion layer in the n-type semiconductor layer 12 is more promoted. Therefore, withstand voltage in a Schottky diode portion is further increased. Further, since the high-concentration p-type doped layers 23b whose impurity concentration is relatively high are in contact with the metal layer 17, it can be more ensured that the potential of the p-type doped layers 21 becomes equal to the potential of the metal layer 17. This is more preferable in view of more promoting the formation of the depletion layer in the n-type semiconductor layer 12 when the backward voltage is applied.

Further, in this embodiment, trenches (third trenches) reaching high-concentration doped layers 23a are also formed in a p-type base layer 13, and the metal layer 17 extends also in these trenches. These trenches (third trenches) can be formed in the same process as that for forming the aforesaid trenches (second trenches). If it is desired to change the depth of the trenches (bottom surface positions thereof) according to a design, the third trenches and the second trenches can be formed in different processes. Further, the high-concentration p-type doped layers 23a are positioned immediately on second doped layers 22 and they are in contact with each other. The impurity concentration of the high-concentration p-type doped layers 23a is higher than that of the p-type doped layers 22 and can be, for example, about $1 \times 10^{20}$ cm$^{-3}$. The high-concentration p-type doped layers 23a also function as contact layers (p-type contact layers 15 in FIG. 1) between the metal layer 17 and the p-type base layer 13.

With such a structure, it is more ensured that the potential of the p-type doped layers 22 becomes equal to the potential of the metal layer 17, which produces a higher effect of preventing a depletion layer from being formed in the p-type base layer 13 in a larger range when the backward voltage is applied. This is preferable in view of more easily lowing withstand voltage in the transistor portion. Further, since the high-concentration p-type doped layers 23a whose impurity concentration is relatively high are in contact with the metal layer 17, it can be more ensured that the potential of the p-type doped layers 22 becomes equal to the potential of the metal layer 17. This is more preferable in view of more preventing the formation of the depletion layer in the p-type base layer 13 when the backward voltage is applied.

In this embodiment, instead of the upper surfaces of the n-type diffusion layers 14, side surfaces of the n-type diffusion layers 14 in the trenches are in contact with the metal layer 17 as shown in FIG. 4.

The p-type doped layers 21 and the p-type doped layers 22 can be formed by the same process as described previously. As for the formation order thereof, for example, their formation comes after the formation of the corresponding trenches. That is, after the formation of the trenches, p-type impurities are implanted in the trenches at a relatively high acceleration voltage and these impurities are thermally diffused, whereby the p-type doped layers 21, 22 are formed. Thereafter, p-type impurities are implanted in the trenches at a relatively lower acceleration voltage and are thermally diffused, whereby the p-type doped layers 23b, 23a can be formed.

Hitherto, the embodiments of the present invention are described, but the present invention is not limited to these embodiments, and various modifications, additions, and so on can be made within a range not departing from the spirit of the present invention.

The present invention is not limited to the specific forms described here with reference to the drawings, and it should be understood that all the modifications that fall within the range of the following claims are included in the present invention.

What is claimed is:

1. A trench gate semiconductor device, comprising:
   a semiconductor layer of a first conductivity type;
   a diffusion region of a second conductivity type formed as a planar structure on the semiconductor layer of the first conductivity type;
   a diffusion region of the first conductivity type positioned selectively on an upper side of the diffusion region of the second conductivity type so as to be in contact with the diffusion region of the second conductivity type;
   a gate electrode provided in a first trench via a gate insulation film, the first trench being formed in plurality in substantially one direction and each being formed to face the diffusion region of the first conductivity type and to penetrate through the diffusion region of the second conductivity type to reach the semiconductor layer of the first conductivity type; and
   a first semiconductor region of the second conductivity type provided at a position, at a first depth internally in the semiconductor layer of the first conductivity type, apart in a lateral direction from the diffusion region of the second conductivity type;
   a second semiconductor region of the second conductivity type provided at a position, at a second depth internally in the diffusion region of the second conductivity type, between adjacent trenches among the first trenches, the second depth being close to a depth of a boundary of the diffusion region of the second conductivity type and the semiconductor layer of the first conductivity type, and the first depth being substantially same as the second depth; and
   a main electrode formed in contact with the semiconductor layer of the first conductivity type and the diffusion region of the first conductivity type.

2. The trench gate semiconductor device according to claim 1,
   wherein the first semiconductor region is formed in plurality substantially in a same horizontal plane to be apart from each other.

3. The trench gate semiconductor device according to claim 1,
   wherein the main electrode extends in a second trench which is formed in the semiconductor layer of the first conductivity type so as to reach the first semiconductor region.

4. The trench gate semiconductor device according to claim 3,
   wherein the first semiconductor region has a first portion having a first impurity concentration and a second portion positioned on the first portion and having a second impurity concentration higher than the first impurity concentration.

5. The trench gate semiconductor device according to claim 1,
   wherein the main electrode extends in a third trench which is formed in the diffusion region of the second conductivity type so as to reach the second semiconductor region.

6. The trench gate semiconductor device according to claim 5,
   wherein the second semiconductor region has a first portion having a relatively low impurity concentration and a second portion positioned on the first portion and having a relatively high impurity concentration.

7. The trench gate semiconductor device according to claim 1,
   wherein the diffusion region of the second conductivity type is formed in an island shape in the semiconductor layer of the first conductivity type in a plane view, and the semiconductor layer of the first conductivity type is further present in an island shape in the diffusion region of the second conductivity type formed in the island shape in the plane view.

8. The trench gate semiconductor device according to claim 7,
   wherein the first semiconductor region is provided at a depth position in the semiconductor layer of the first conductivity type which is further present in the island shape in the diffusion region of the second conductivity type in the island shape in the plane view.

9. The trench gate semiconductor device according to claim 7,
   wherein the first semiconductor region is provided at a depth position in the semiconductor layer of the first conductivity type which is positioned outside the diffusion region of the second conductivity type in the island shape.

10. The trench gate semiconductor device according to claim 1,
    wherein the second semiconductor region is provided at a substantially center position between the adjacent trenches.

11. The trench gate semiconductor region according to claim 5,
   wherein the main electrode is in contact with the diffusion region of the first conductivity type only along a sidewall of the third trench.

12. The trench gate semiconductor device according to claim 1,
   wherein the first conductivity type is an n-type and the second conductivity type is a p-type.

13. The trench gate semiconductor device according to claim 1, further comprising:
   a semiconductor substrate of the first conductivity type provided on a side, of the semiconductor layer of the first conductivity type, opposite a side where the diffusion region of the second conductivity type is provided; and
   a second main electrode provided on a side, of the semiconductor substrate of the first conductivity type, opposite a side where the semiconductor layer of the first conductivity type is provided.

14. The trench gate semiconductor device according to claim 1,
   wherein the first trench is formed in the plurality substantially in the one direction, and the first trench is further formed in plurality in a direction orthogonal to the one direction.

15. The trench gate semiconductor device according to claim 6,
   wherein the second portion of the semiconductor region is a portion via which the diffusion region of the second conductivity type and the main electrode are configured to be in electrical conductivity with each other.

16. The trench gate semiconductor device according to claim 1,
   wherein the main electrode extends in a second trench which is formed in the semiconductor layer of the first conductivity type so as to reach the first semiconductor region;
   wherein the first semiconductor region has a first portion having a first impurity concentration and a second portion positioned on the first portion and having a second impurity concentration higher than the first impurity concentration;
   wherein the main electrode extends in a third trench which is formed in the diffusion region of the second conductivity type so as to reach the second semiconductor region;
   wherein the second semiconductor region has a first portion having a relatively low impurity concentration and a second portion positioned on the first portion and having a relatively high impurity concentration; and
   wherein the second portion of the first semiconductor region and the second portion of the second semiconductor region are provided in a substantially same horizontal plane.

17. The trench gate semiconductor device according to claim 1,
   wherein the first semiconductor region and the second semiconductor region are regions simultaneously formed by a same implantation process.

* * * * *